United States Patent [19]
Gardner et al.

[11] Patent Number: 5,891,787
[45] Date of Patent: Apr. 6, 1999

[54] SEMICONDUCTOR FABRICATION EMPLOYING IMPLANTATION OF EXCESS ATOMS AT THE EDGES OF A TRENCH ISOLATION STRUCTURE

[75] Inventors: Mark I. Gardner, Cedar Creek; H. Jim Fulford; Derick J. Wristers, both of Austin, all of Tex.

[73] Assignee: Advanced Micro Devices, Inc.

[21] Appl. No.: 923,181

[22] Filed: Sep. 4, 1997

[51] Int. Cl.$^6$ ...................................................... H01L 21/76
[52] U.S. Cl. ........................... 438/424; 438/524; 438/528
[58] Field of Search .................................. 438/424, 162, 438/276, 369, 407, 440, 520, 528

[56] References Cited

U.S. PATENT DOCUMENTS

| | | | |
|---|---|---|---|
| 4,942,137 | 7/1990 | Sivan et al. | 438/426 |
| 5,561,072 | 10/1996 | Saito | 438/528 |
| 5,789,305 | 8/1998 | Peidous | 438/440 |
| 5,795,811 | 8/1998 | Kim et al. | 438/435 |
| 5,811,347 | 9/1998 | Gardner et al. | 438/435 |

*Primary Examiner*—Olik Chaudhuri
*Assistant Examiner*—Anh D. Mai
*Attorney, Agent, or Firm*—Kevin L. Daffer; Conley, Rose & Tayon

[57] ABSTRACT

A method for isolating a first active region from a second active region, both of which are configured within a semiconductor substrate. The method comprises forming a dielectric masking layer above a semiconductor substrate. An opening is then formed through the masking layer. A pair of dielectric spacers are formed upon the sidewalls of the masking layer within the opening. A trench is then etched in the semiconductor substrate between the dielectric spacers. A first dielectric layer is then thermally grown on the walls and base of the trench. A CVD oxide is deposited into the trench and processed such that the upper surface of the CVD oxide is commensurate with the substrate surface. Portions of the spacers are also removed such that the thickness of the spacers is between about 0 to 200 Å. Silicon atoms and/or barrier atoms, such as nitrogen atoms, are then implanted into regions of the active areas in close proximity to the trench isolation structure.

17 Claims, 5 Drawing Sheets

SEMICONDUCTOR FABRICATION EMPLOYING IMPLANTATION OF EXCESS ATOMS AT THE EDGES OF A TRENCH ISOLATION STRUCTURE

BACKGROUND OF THE INVENTION

1. Field of the Invention

This invention relates to integrated circuit fabrication and more particularly to an improved process of implanting excess atoms within active areas of a semiconductor substrate laterally adjacent to a trench isolation structure to enhance properties of the integrated circuit.

2. Description of the Relevant Art

The fabrication of an integrated circuit involves placing numerous devices in a single semiconductor substrate. Select devices are interconnected by conductors which extend over a dielectric that separates or "isolates" those devices. Implementing an electrical path across a monolithic integrated circuit thus involves selectively connecting devices which are isolated from each other. When fabricating integrated circuits it is therefore necessary to isolate devices built into the substrate from one another. From this perspective, isolation technology is one of the critical aspects of fabricating a functional integrated circuit.

A popular isolation technology used for a MOS integrated circuit involves the process of locally oxidizing silicon. Local oxidation of silicon, or LOCOS processing involves oxidizing field regions of a silicon-based substrate between device areas. The oxide grown in the field or isolation regions is termed "field oxide". The field oxide is grown during the initial stages of integrated circuit fabrication, before source and drain implants are placed in device areas or active areas. By growing a thick field oxide in field regions pre-implanted with a channel-stop dopant, LOCOS processing serves to prevent the establishment of parasitic channels in the field regions.

While LOCOS has remained a popular isolation technology, there are several problems associated with LOCOS. First, a growing field oxide extends laterally as a bird's-beak structure. In many instances, the bird's-beak structure can unacceptably encroach into the device active area. Second, the pre-implanted channel-stop dopant redistributes during the high temperatures associated with field oxide growth. Redistribution of channel-stop dopant primarily affects the active area periphery, causing problems known as narrow-width effects. Third, the thickness of field oxide causes large elevational disparities across the semiconductor topography between field and active regions. Topographical disparities cause planarity problems which become severe as circuit critical dimensions shrink. Lastly, thermal oxide growth is significantly thinner in small field regions (i.e., field areas of small lateral dimension) relative to large field regions. In small field regions, a phenomenon known as field-oxide-thinning effect therefore occurs. Field-oxide-thinning produces problems with respect to field threshold voltages, interconnect-to-substrate capacitance, and field-edge leakage in small field regions between closely spaced active areas.

Many of the problems associated with LOCOS technology are alleviated by an isolation technique known as the "shallow trench process". The shallow trench process is particularly suited for isolating densely spaced active devices having field regions less than one micron in lateral dimension. Conventional trench processes involve the steps of etching a silicon substrate surface to a relatively shallow depth, e.g., between 0.2 to 0.5 microns, and then refilling the shallow trench with a deposited dielectric. The trench is then planarized to complete formation of the isolation structure. The trench process eliminates bird's-beak and channel-stop dopant redistribution problems. In addition, the isolation structure is fully recessed, offering at least a potential for a planar surface. Still further, field-oxide thinning is reduced in narrow isolation spaces, and the threshold voltage is constant as a function of channel width.

While the conventional trench isolation process has many advantages over LOCOS, the trench process also has problems. Because trench formation involves etching of the silicon substrate, it is believed that dangling bonds and an irregular grain structure form in the silicon substrate near the walls of the trench. Such dangling bonds may promote trapping of charge carriers within the active areas of an operating transistor. As a result, charge carrier mobility may be hindered, and the output current, $I_D$, of the transistor may decrease to an amount at which optimum device performance is unattainable.

Further, during subsequent anneal steps (e.g., thermal oxidation for gate oxide formation), the irregular grain structure may provide migration avenues through which oxygen atoms can pass from the trench isolation structures to the active areas. Moreover, the dangling bonds may provide opportune bond sites for diffusing oxygen atoms, thereby promoting accumulation of oxygen atoms in the active areas near the edges of the isolation structures. It is believed that oxygen atoms present in active areas of the silicon may function as electron donors. Thus, inversion of subsequently formed p-type active areas may undesirably occur near the walls of the isolation trench. Further, the edge of a device may conduct less current than the interior portion of the device. Therefore, more charge to the gate of a transistor may be required to invert the channel, causing threshold voltage, $V_T$, to shift undesirably from its design specification.

It is postulated that during the growth of a gate oxide across regions of the substrate exclusive of the isolation regions, the presence of foreign oxygen atoms at the surface of the silicon crystal lattice may lead to a relatively high defect density in the gate oxide. It is further postulated that foreign oxygen atoms accumulating within the active areas may result in regions of the substrate having a high defect density. For example, clusters of foreign atoms may cause dislocations to form in the substrate. It is also believed that low breakdown voltages in thin gate oxides correlate with high defect density near the surface of the substrate.

In a subsequent processing step, the active areas of the semiconductor substrate may be implanted with impurity species to form source/drain regions therein. The semiconductor topography may be subjected to a high temperature anneal to activate the impurity species in the active areas and to annihilate crystalline defect damage of the substrate. Unfortunately, impurity species which have a relatively high diffusivity, such as boron, may undergo diffusion into the isolation region when subjected to high temperatures. As a result, the threshold voltage in the isolation region may decrease and current may inadvertently flow (i.e., leakage) between isolated active areas.

It is therefore desirable to develop a technique for forming a trench isolation structure between active areas in which problems related to dangling bonds and to an irregular grain structure at the edges of the active areas are alleviated. Such a technique is necessary to inhibit charge carriers and oxygen donors from being entrapped in the active areas. It is also necessary that the trench isolation technique provide for the growth of a high quality gate oxide which does not easily undergo breakdown. Yet further, it is desirable that inversion of silicon within the active areas near the edges of the trench isolation structures be prevented.

SUMMARY OF THE INVENTION

The problems noted above are in large part solved by the method hereof for isolating active areas within a semiconductor substrate. That is, the present invention contemplates the formation of a trench isolation structure between active areas of a semiconductor substrate. Advantageously, excess atoms are incorporated in the active areas adjacent to the walls of the trench to enhance the properties of both the isolation structure and of devices employing the active areas. Herein, excess atoms may be silicon atoms in addition to the atoms of the single crystalline silicon substrate or other impurity atoms.

According to an embodiment of the present invention, a semiconductor topography is provided in which a masking layer is formed above a semiconductor substrate. An opening is formed vertically through the masking layer, and a dielectric spacer material is deposited across the exposed surface of the topography. The spacer material is then anisotropically etched to form spacers directly adjacent to opposed sidewall surfaces of the masking layer opening. The spacers are strategically placed above regions of the substrate into which excess atoms are to be subsequently implanted. An isolation trench is then etched into the semiconductor substrate between the spacers. The resulting trench is relatively shallow and is interposed between ensuing active areas of the semiconductor substrate.

An oxide (i.e., $SiO_2$) layer may be thermally grown within the trench on the exposed edges of the substrate. Oxide may then be deposited using chemical vapor deposition ("CVD") into the trench and across the masking layer surface. Chemical-mechanical polishing ("CMP") may be used to planarize the upper surface of the masking layer. The oxide may then be etched down to an elevation commensurate with the upper surface of the semiconductor substrate. The spacers may be concurrently etched down to near the surface of the substrate. The resulting trench isolation region includes both a thermally grown oxide and a deposited oxide. As described previously, a shallow isolation trench which is filled with a deposited oxide has many benefits over LOCOS isolation structures. However, deposited oxide is generally less dense than thermally grown oxide and has an altered stoichiometry that can cause changes in the mechanical and electrical properties of the film. Thermally grown oxide, on the other hand, has a generally uniform stoichiometry arrangement which provides for consistent electrical isolation. Accordingly, thermally grown oxide is strategically arranged at the periphery of the trench adjacent to the active areas which require electrical isolation. The remaining bulk of the isolation structure is CVD oxide.

Ion implantation may then be performed to implant silicon atoms into exposed areas of the semiconductor topography, particularly into areas of the semiconductor substrate directly under the spacers and adjacent to the walls of the trench. Acceleration of the ions may be controlled so as to move the ions into those critical areas of the substrate. The masking layer thickness is pre-selected to prevent the ions from passing into the regions of the semiconductor substrate directly under the masking layer. The masking layer and any remaining portions of the spacers are removed in preparation for the growth of a gate oxide across the substrate.

Silicon atoms thusly placed in the semiconductor substrate may contribute many useful features to active area isolation. They may fill vacancies and interstitial sites within the silicon crystal lattice. Thus, the silicon atoms may "stuff" grain-boundary diffusion pathways into and out of the active areas, thereby preventing cross-diffusion of impurities between the isolation structures and the active areas. As a result, problems associated with these occurrences, such as current leakage between active areas and edge inversion of a transistor may be reduced. Furthermore, the silicon atoms may promote the formation of a high quality silicide above regions of the active areas incorporated with the excess silicon atoms. Silicide, i.e., self-aligned silicide, formation above active areas of transistors is a well known technique. During salicide formation, metal atoms are reacted with silicon atoms at the surface of the substrate. Since the presence of excess silicon atoms in the active areas helps prevent impurity atoms from entering the active areas, such impurity atoms may also be inhibited from being incorporated in the salicide. The resulting salicide may thus be free of such impurities.

Moreover, it is believed that the growth rate of a thermally grown oxide at the surface of the substrate above those regions densely packed with silicon atoms is increased. Thus, a thicker gate oxide may be formed above regions of the substrate adjacent to the edges of the trench isolation structure. The formation of a thicker gate oxide in these regions may cause the threshold voltage at the edges of the active areas to increase such that edge inversion of operating transistors is prevented. Since the gate oxide thickness above other regions of the substrate is kept relatively thin, the threshold voltage of transistors employing the active areas may be maintained at its desired value. Yet further, the growth of a thicker gate oxide advantageously raises the breakdown voltage of the oxide, making oxide breakdown less likely. It is also believed that since the silicon atoms help inhibit oxygen atoms from entering the active areas and becoming entrapped by dangling bonds, defect density of an oxide grown above the active areas is reduced.

In an alternate embodiment, barrier atoms, e.g., nitrogen, argon, or germanium atoms, instead of silicon atoms may be implanted into those regions of the active areas disposed under the spacers and adjacent to the trench isolation structure. Thusly placed, barrier atoms may fill voids in an irregular grain structure which could have resulted when etching the trench. If nitrogen barrier atoms are implanted, they may bond with available silicon atoms such that opportune bond sites no longer exist within the active areas. Further, the barrier atoms may fill interstitial sites between silicon atoms. Thus, barrier atoms may block grain-boundary diffusion pathways into and out of the active areas. Therefore, impurities are inhibited from passing into the trench isolation structure and oxygen atoms are inhibited from passing into the active areas. Therefore, current leakage between active areas and edge inversion of a transistor may be prevented. Moreover, charge carrier entrapment in the active areas may be reduced since barrier atoms have terminated many of the dangling bonds. Since Si—N bonds are stronger and less strained than Si—O bonds, nitrogen barrier atoms are better suited for inhibiting the immobility of charge carriers near the edges of a transistor.

In yet another embodiment, both silicon atoms and nitrogen atoms may be implanted into regions of the active areas adjacent the isolation structure. Many of the benefits of using silicon atoms and nitrogen atoms individually also apply when both are used. The nitrogen atoms may, however, counter the effect that the silicon atoms have on the growth of a gate oxide at the surface of the substrate. Thus, the growth of the gate oxide might be no faster above these implanted regions than above the other regions of the substrate.

BRIEF DESCRIPTION OF THE DRAWINGS

Other objects and advantages of the invention will become apparent upon reading the following detailed description and upon reference to the accompanying drawings in which:

FIG. 13 is a cross-sectional view of the semiconductor topography, wherein the masking layer, the oxide layer, and the spacers are removed from the upper surface of the substrate, subsequent to the step in FIG. 12a;

DETAILED DESCRIPTION OF THE INVENTION

Figure 1:
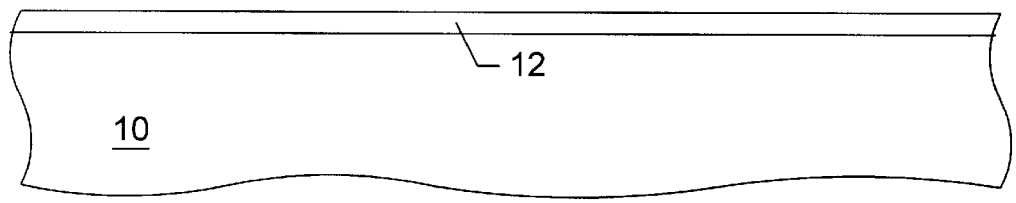
FIG. 1 is a partial cross-sectional view of a semiconductor topography, wherein an oxide layer is grown across a semiconductor substrate.
Figure 2:
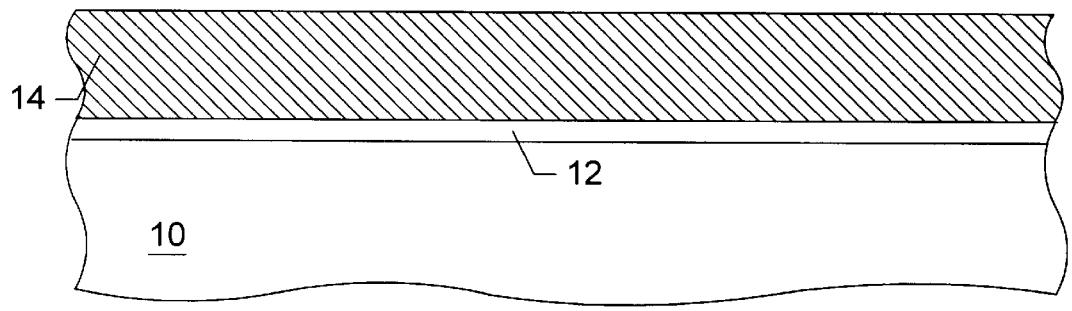
FIG. 2 is a cross-sectional view of the semiconductor topography, wherein a dielectric masking layer is deposited across the oxide layer, subsequent to the step in FIG. 1.
Figure 3:
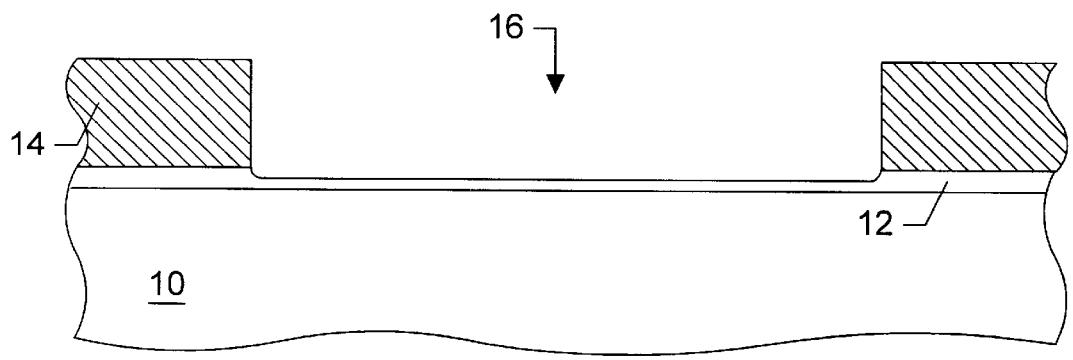
FIG. 3 is a cross-sectional view of the semiconductor topography, wherein an opening is etched vertically through the masking layer and partially through the oxide layer, subsequent to the step in FIG. 2.

Turning now to the drawings, FIG. 1 depicts a semiconductor substrate 10 across which a thin layer of thermally grown oxide 12 is disposed. Semiconductor substrate 10 comprises single crystalline silicon. As shown in FIG. 2, a dielectric masking layer 14, preferably nitride ($Si_3N_4$), may be deposited across oxide layer 12. The nitride deposition may be performed using, e.g., a horizontal tube LPCVD reactor. Oxide layer 12 is a "pad oxide" which reduces inherent stresses that exist between CVD nitride on silicon. FIG. 3 depicts the etching of a contiguous opening 16 through masking layer 14 and partially through oxide layer 12. A dry, plasma etch technique may be used to form opening 16 in which etch duration is chosen to terminate just before reaching the surface of substrate 10. It is also possible to etch through the entire thickness of oxide layer 12, but overetching may result in unwanted removal of the underlying substrate 10.

Figure 4:
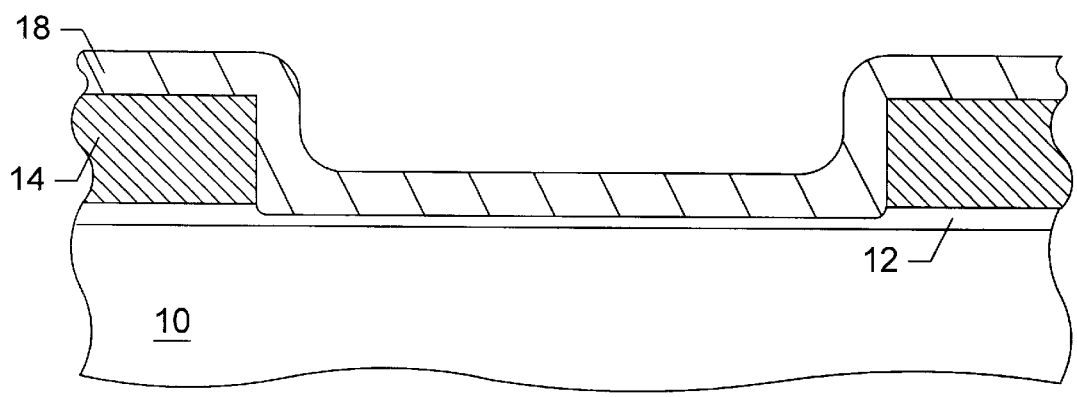
FIG. 4 is a cross-sectional view of the semiconductor topography, wherein a dielectric material is deposited across the exposed surface of the topography, subsequent to the step in FIG. 3.
Figure 5:
FIG. 5 is a cross-sectional view of the semiconductor topography, wherein the dielectric material is anisotropically etched to form spacers adjacent to sidewalls of the masking layer opening, subsequent to the step in FIG. 4.

FIG. 4 illustrates the chemical vapor deposition of a dielectric material 18, e.g., oxide, nitride, or oxynitride, across the exposed surfaces of masking layer 14 and oxide layer 12. Dielectric material 18 may be anisotropically etched to form spacers 20 which are depicted in FIG. 5. Since anisotropic etch removes material at a faster rate vertically than horizontally, etch duration is chosen to terminate before bombarding etchant ions may attack a predetermined thickness of the dielectric material disposed immediately adjacent to the sidewall surfaces of masking layer 14. Preferably the thickness of each of the remaining spacers 20 is about 0.1 micron in the lateral (horizontal) direction.

Figure 6:
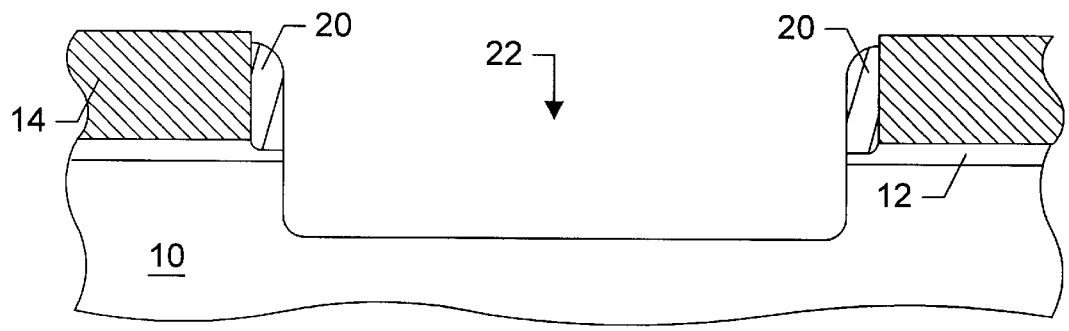
FIG. 6 is a cross-sectional view of the semiconductor topography, wherein a trench is etched in a region of the substrate defined between the spacers, subsequent to the step in FIG. 5.
Figure 7:
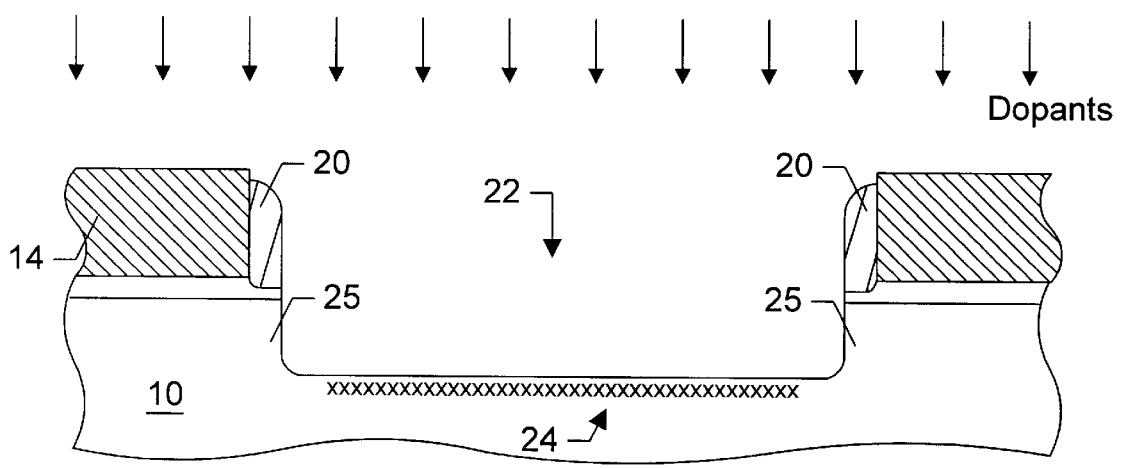
FIG. 7 is a cross-sectional view of the semiconductor topography, wherein a channel-stop implant is forwarded into a region of the substrate underlying the trench, subsequent to the step in FIG. 6.

Turning to FIG. 6, a trench 22 may be anisotropically etched in a region of substrate 10 defined between spacers 20. Prior to etching substrate 10, a photoresist masking layer (not shown) may be patterned directly above masking layer 14 and spacers 20 using well known optical lithography techniques to prevent removal of these structures during the etch process. FIG. 7 depicts dopants being implanted into a region 24 of substrate 10 directly below trench 22. Masking layer 14 and spacers 20 prevent implants from entering material beneath those regions. Only the trench 24, exposed between spacers 20, receives the blanket implant. This implant is performed to create a channel-stop doping layer under the ensuing field oxide. The type of dopants chosen for the channel-stop implant is opposite to that used during a later implant into active areas 25 which are separated by trench 22. A $p^+$ implant of boron or an $n^+$ implant of arsenic may, e.g., be used.

Figure 8:
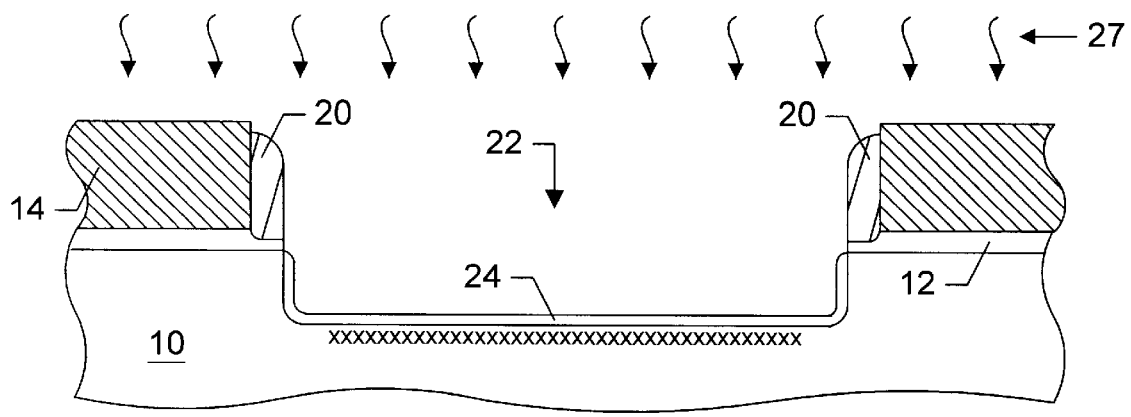
FIG. 8 is a cross-sectional view of the semiconductor topography, wherein a layer of oxide is thermally grown across the walls and the base of the trench, subsequent to the step in FIG. 7.
Figure 9:
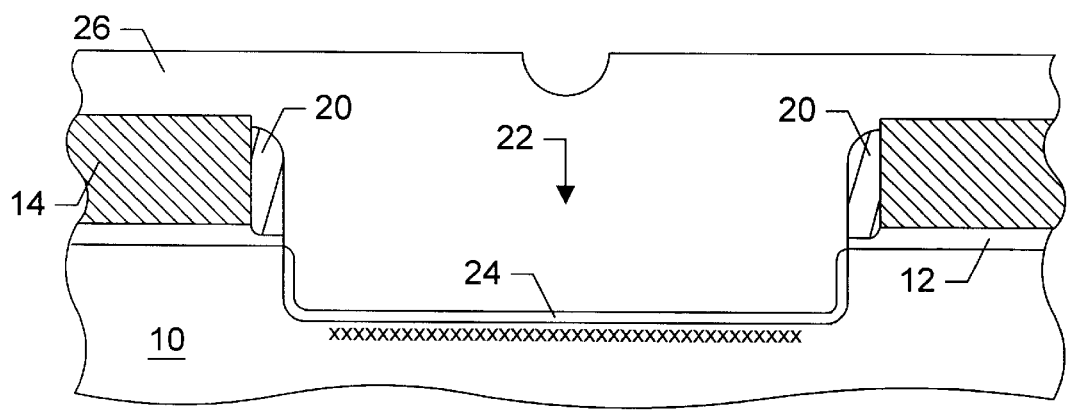
FIG. 9 is a cross-sectional view of the semiconductor topography, wherein a dielectric is deposited across the topography up to an elevation which is a spaced distance above the surface of the masking layer, subsequent to the step in FIG. 8.
Figure 10:
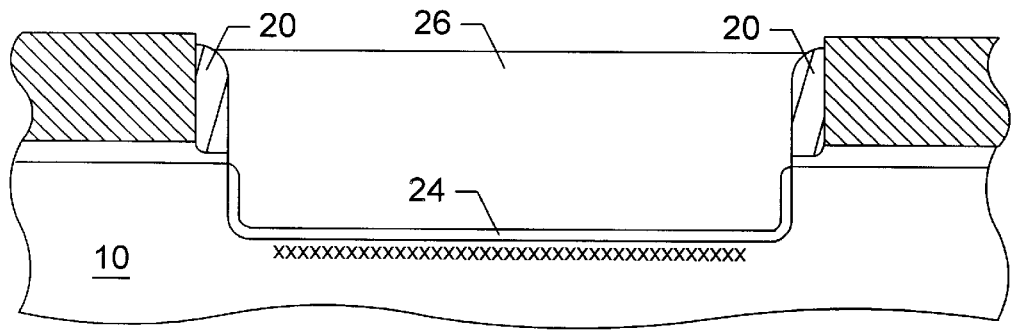
FIG. 10 is a cross-sectional view of the semiconductor topography, wherein the deposited dielectric is concurrently planarized and removed down to an elevation near the surface of the masking layer, subsequent to the step in FIG. 9.

As shown in FIG. 8, the semiconductor topography is then exposed to thermal radiation 27, resulting in the oxidation of exposed silicon within substrate 10. A thermally grown oxide layer 24 is thusly formed which lines the walls and the base of trench 22. FIG. 9 depicts the deposition of a fill dielectric material 26, e.g., CVD oxide into trench 22. The fill oxide 26 is deposited until the upper surface of the material is at an elevation above the surface of masking layer 14. Subsequently, chemical-mechanical polishing (CMP), or a combination of etchback and/or CMP, may be used to simultaneously planarize the upper surface of fill oxide 26 and remove the material down to an elevation proximate the peaks of spacers 20.

Figure 11:
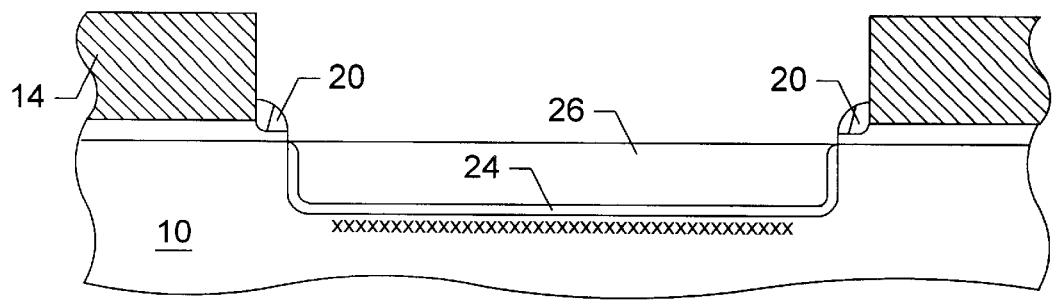
FIG. 11 is a cross-sectional view of the semiconductor topography, wherein the deposited dielectric and the spacers are etched such that the upper surface of the dielectric is level with the surface of the substrate, subsequent to the step in FIG. 10.

Turning to FIG. 11, fill oxide 26 may then be etched such that its upper surface is commensurate with the surface of substrate 10. A photoresist masking layer may be patterned above masking layer 14 to prevent removal of masking layer 14 during the etch process. Fill oxide 26 combined with oxide layer 24 form a trench isolation structure. Spacers 20 are concurrently etched along with fill oxide 26 such that they each have a thickness of between 0 to 200 Å, depending on the etch process used and the type of spacer material. For example, if a dry, plasma etch which has low selectivity relative to oxide is used to etch fill oxide 26, almost all of spacers 20 may be removed. A large portion of spacers 20 may also be removed using an etch step that is highly selective to oxide if the spacers are composed of oxide. Conversely, if spacers 20 are made of oxynitride or nitride and an etch technique which is highly selective to oxide is performed, less of the spacers 20 may be removed. Nitride spacers would be thicker than oxynitride spacers after an oxide selective etch, e.g., a wet etch process using a hydrofluoric acid solution. A relatively short or thin residual spacer is deemed important in allowing barrier atom ingress into the substrate directly beneath the barrier, as described below.

Figure 12A:
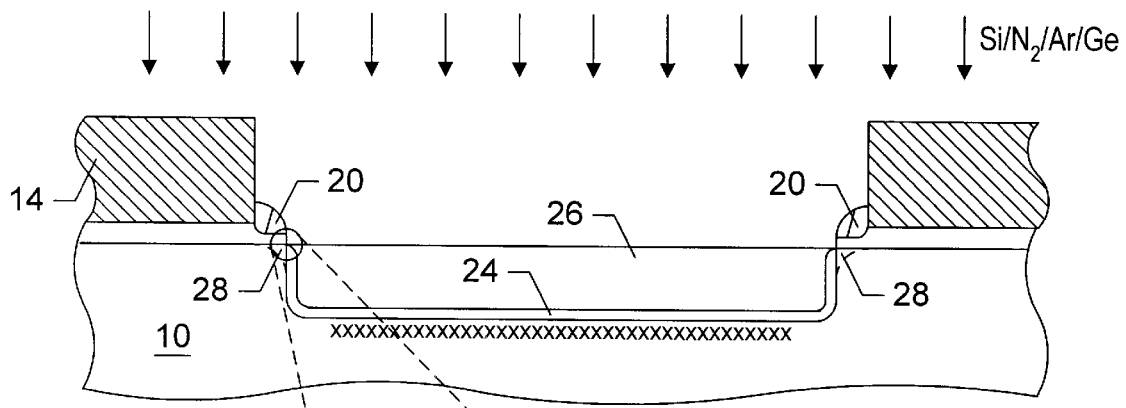
FIG. 12a is a cross-sectional view of the semiconductor topography, wherein excess atoms are incorporated into regions of the topography using ion implantation, subsequent to the step in FIG. 11.

As depicted in FIG. 12a, silicon ions may be implanted into the semiconductor topography. In addition to the silicon ions, barrier ions, e.g. nitrogen, argon, or germanium ions may also be forwarded to the topography using ion implantation. Alternately, only barrier ions and no silicon ions may be implanted. The use of ion implantation provides for tight control of the depth at which the excess atoms come to reside. Ion acceleration is chosen so as to incorporate excess silicon and/or barrier atoms into regions 28 of substrate 10. Masking layer 14 inhibits the excess atoms from passing to other regions of substrate 10. The excess atoms may also become implanted near the surface of the trench isolation structure. Spacers 20 are strategically disposed above regions 28 and between masking layer 14 and the trench isolation structure. Since a large portion of spacers 20 have been removed from the sidewalls of masking layer 14, the ions may be forwarded through the relatively thin spacers 20 to regions 28 which are disposed in close proximity to the trench isolation structure.

Figure 12B:
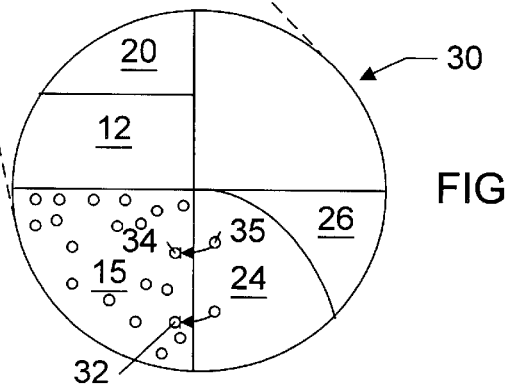
FIG. 12b is a detailed view along section 30 of FIG. 12a, wherein the excess atoms are shown as being incorporated into active areas of the substrate laterally adjacent to the isolation trench structure.

FIG. 12b depicts a detailed view along section 30 of FIG. 12a. Active area 15 may form a source and drain region of a transistor in subsequent processing steps. Silicon atoms 32 and/or nitrogen atoms 34 are shown as being incorporated in close proximity to the thermal oxide 24/active area 15 interface. The implanted atoms may fill vacancies and interstitial sites within the silicon crystal lattice of active area 15. Thus, in subsequent processing when the semiconductor topography is exposed to heat, silicon atoms 32 and/or nitrogen atoms 34 may block or "stuff" migration pathways of oxygen atoms 35 from the isolation structure into active area 15. The excess atoms may also block impurity species in active area 15 from passing to the trench isolation structure. Further, Si—N bonds which are relatively strong may form, reducing the possibility of species such as charge carriers becoming trapped by dangling bonds. As shown later, silicon atoms 32 may also increase the growth rate of a thermally grown oxide at the surface of region 28.

Figure 13:
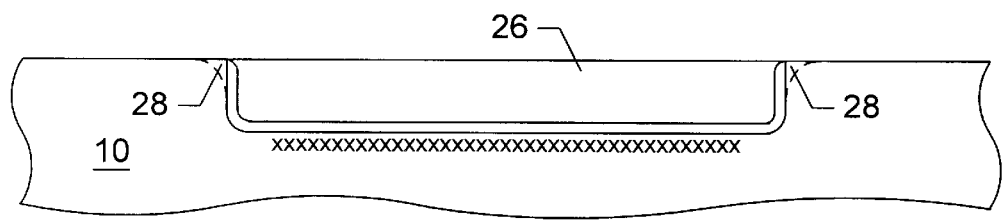
Figure 14:
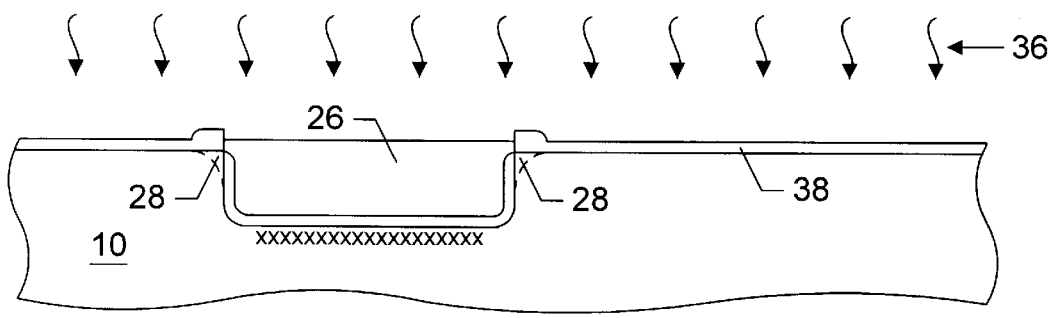
FIG. 14 is a cross-sectional view of the semiconductor topography, wherein a gate oxide is grown across the surface of the semiconductor substrate, subsequent the step in FIG. 13.

After incorporating nitrogen atoms into regions 28 of active areas 15, the semiconductor topography undergoes preparation for subsequent formation of transistors which are to be isolated from each other by the trench isolation structure. As shown in FIG. 13, masking layer 14, spacers 20, and oxide layer 12 may be etched away. They may be removed using, e.g., various wet etch techniques. For instance, if masking layer 14 and spacers 20 are composed of nitride, these structures may be etched using reflux boiled phosphoric acid. Oxide layer 12 may then be removed using a hydrofluoric acid solution as the etchant. After cleaning any contaminants from the surface of the semiconductor topography, a gate oxide 38 may be grown across the surface, as shown in FIG. 14. Exposure of the topography to thermal radiation 36 is used to promote the oxidation of the silicon at the surface of substrate 10. As mentioned earlier, if regions 28 include excess silicon atoms, the oxide growth rate above these regions may be faster than above other areas of the substrate. Thus, the gate oxide 38 may be thicker above regions 28.

Figure 15:
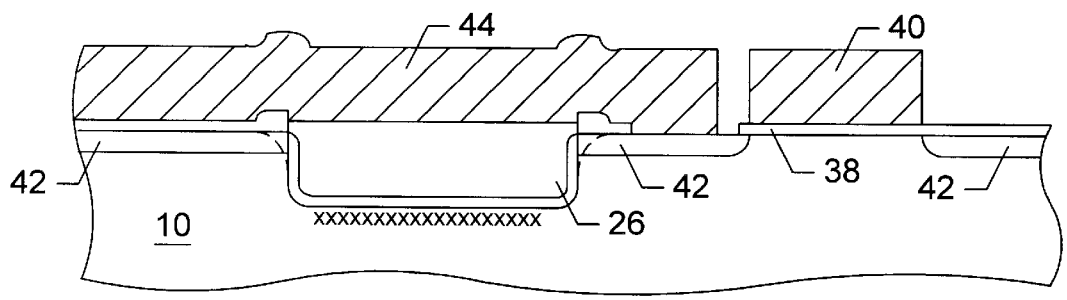
FIG. 15 is a cross-sectional view of the semiconductor topography, wherein a transistor is formed adjacent to the isolation trench structure and a local interconnect is formed which is coupled to a junction of the transistor.

Turning to FIG. 15, source/drain ("S/D") regions 42 are shown as being formed in the active areas of substrate 10, according to one embodiment. The formation of S/D regions 42 may involve implanting dopants into areas of the substrate not covered by a masking layer. A region of gate oxide 38 is exclusively etched away using e.g., a wet oxide etch to expose a portion of one of the S/D regions 42. A polysilicon layer may then be deposited across the surface of the semiconductor topography. Portions of the polysilicon may be etched away and doped to form a gate conductor 40 between S/D regions 42 and a local interconnect 44 coupled to one of the S/D regions. Gate oxide 38 is maintained beneath interconnect 44 so as to electrically isolate local interconnect 44 from all other electrically active areas. Local interconnect 44 may extend a relatively short distance to a gate or S/D region of another transistor. Local interconnect 44 may also be made of other materials, such as metals. The active areas isolated by the method hereof may also be used to form transistors to which dielectrically isolated contacts can be formed. Interconnects dielectrically isolated above the transistors may be formed between different contacts, thereby placing certain active areas in electrical communication with each other.

It will be appreciated to those skilled in the art having the benefit of this disclosure that this invention is believed to provide a method for forming actives areas isolated from each other by a trench isolation structure in which the isolation structure and devices employing the active areas have enhanced properties. It is intended that the following claims be interpreted to embrace all such modifications and changes and, accordingly, the specification and drawings are to be regarded in an illustrative rather than a restrictive sense.

What is claimed is:

1. A method for forming a trench isolation region, comprising:

providing a semiconductor topography comprising a masking layer disposed above a semiconductor substrate, wherein an opening is formed vertically through said masking layer;

forming first and second dielectric spacers laterally adjacent to opposed sidewall surfaces of said opening;

etching a trench within said substrate between said first and second dielectric spacers;

forming dielectric material within said trench and said opening;

removing portions of said dielectric material and portions of said first and second dielectric spacers such that an upper surface of said dielectric material is approximately commensurate with an upper surface of said substrate; and implanting silicon atoms in areas of said substrate directly beneath said first and second spacers and laterally adjacent to sidewalls of said trench.

2. The method of claim 1, wherein said masking layer comprises silicon nitride, and wherein said semiconductor topography further comprises an oxide layer interposed between said semiconductor substrate and said masking layer, and wherein said opening extends at least partially through said oxide layer.

3. The method of claim 1, wherein the step of forming said first and second dielectric spacers comprises:

depositing an insulative layer across exposed surfaces of said masking layer and said opening; and etching said insulative layer at a greater rate perpendicular to said semiconductor substrate than parallel to said semiconductor substrate to form said first and second dielectric spacers.

4. The method of claim 3, wherein said insulative layer comprises a material selected from the group consisting of oxide, nitride, and oxynitride.

5. The method of claim 1, further comprising implanting dopants into an exposed region of said substrate directly under said trench prior to the step of forming said dielectric material in said trench and said opening.

6. The method of claim 1, wherein the step of forming said dielectric material in said trench and said opening comprises:

thermally growing an oxide layer in said trench on exposed regions of said semiconductor substrate;

depositing a fill oxide across said masking layer and into said opening and said trench; and chemical-mechanical polishing said fill oxide to an elevational level directly below an upper surface of said masking layer.

7. The method of claim 1, wherein each of said first and second dielectric spacers comprises a width of about 0.1 micron.

8. The method of claim 1, wherein the step of removing said portions of said dielectric material and said first and second spacers comprises (i) forming a photoresist layer exclusively above said masking layer and (ii) plasma etching or wet etching said portions of said dielectric material and said first and second spacers such that said first and second spacers are about 0 to 200 Å thick.

9. The method of claim 1, further comprising removing said first and second nitride spacers and said masking layer, subsequent to the step of incorporating said silicon atoms.

10. The method of claim 1, wherein said areas of said substrate are portions of active regions of said semiconductor substrate.

11. The method of claim 1, further comprising thermally growing a gate oxide across said semiconductor substrate, wherein said gate oxide comprises a first thickness above said areas and a second thickness above regions of said substrate exclusive of said areas, and wherein said first thickness is greater than said second thickness.

12. The method of claim 1, further comprising implanting nitrogen atoms in said areas of said substrate directly under said first and second spacers and laterally adjacent to said sidewalls of said trench.

13. A method for forming a trench isolation region, comprising:

providing a semiconductor topography comprising a masking layer disposed above a semiconductor substrate, wherein an opening is formed vertically through said masking layer;

forming first and second dielectric spacers laterally adjacent to opposed sidewall surfaces of said opening;

etching a trench within said substrate between said first and second dielectric spacers;

forming dielectric material within said trench and said opening;

removing portions of said dielectric material and portions of said first and second dielectric spacers such that an upper surface of said dielectric material is approximately commensurate with an upper surface of said substrate; and implanting barrier atoms in areas of said substrate directly beneath said first and second spacers and laterally adjacent to sidewalls of said trench.

14. The method of claim 13, wherein said barrier atoms comprise atoms selected from the group consisting of nitrogen atoms, argon atoms, and germanium atoms or combinations thereof.

15. The method of claim 13, wherein the step of forming said dielectric material in said trench and said opening comprises:

thermally growing an oxide layer in said trench on exposed regions of said semiconductor substrate;

depositing a fill oxide across said masking layer and into said opening and said trench; and chemical-mechanical polishing said fill oxide to an elevational level directly below an upper surface of said masking layer.

16. The method of claim 13, wherein each of said first and second dielectric spacers comprises a width of about 0.1 micron.

17. The method of claim 13, wherein the step of removing said portions of said dielectric material and said first and second spacers comprises (i) forming a photoresist layer exclusively above said masking layer and (ii) plasma etching or wet etching said portions of said dielectric material and said first and second spacers such that said first and second spacers are about 0 to 200 Å thick.

* * * * *